(12) United States Patent
Nakayama et al.

(10) Patent No.: US 10,985,210 B2
(45) Date of Patent: Apr. 20, 2021

(54) NONVOLATILE STORAGE DEVICE

(71) Applicant: TOSHIBA MEMORY CORPORATION, Tokyo (JP)

(72) Inventors: Masahiko Nakayama, Kuwana Mie (JP); Toshihiko Nagase, Kuwana Mie (JP); Tomomi Funayama, Mie Mie (JP); Hironobu Furuhashi, Kuwana Mie (JP); Kazumasa Sunouchi, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/559,254

(22) Filed: Sep. 3, 2019

(65) Prior Publication Data

US 2020/0303455 A1 Sep. 24, 2020

(30) Foreign Application Priority Data

Mar. 20, 2019 (JP) .............................. JP2019-053603

(51) Int. Cl.
| | |
|---|---|
| *H01L 27/22* | (2006.01) |
| *H01L 43/02* | (2006.01) |
| *H01L 45/00* | (2006.01) |
| *G11C 11/16* | (2006.01) |
| *H01F 10/32* | (2006.01) |
| *H01L 43/10* | (2006.01) |

(52) U.S. Cl.
CPC .......... *H01L 27/224* (2013.01); *G11C 11/161* (2013.01); *H01F 10/3254* (2013.01); *H01L 43/02* (2013.01); *H01L 45/1233* (2013.01); *H01L 45/141* (2013.01); *H01F 10/329* (2013.01); *H01F 10/3286* (2013.01); *H01L 43/10* (2013.01)

(58) Field of Classification Search
CPC ..... H01L 27/224; H01L 43/02; H01L 45/141; H01L 43/10; H01F 10/3254; H01F 10/3285; G11C 11/161
USPC .......................................... 257/4, 295; 438/3
See application file for complete search history.

(56) References Cited

U.S. PATENT DOCUMENTS

| | | |
|---|---|---|
| 9,263,675 B2 | 2/2016 | Ramaswamy |
| 9,812,499 B1 | 11/2017 | Satoh et al. |

(Continued)

FOREIGN PATENT DOCUMENTS

JP 2010067942 A 3/2010

*Primary Examiner* — Thinh T Nguyen
(74) *Attorney, Agent, or Firm* — Kim & Stewart LLP

(57) ABSTRACT

A nonvolatile storage device includes first and second interconnections and a memory cell between the first and second interconnections. The memory cell includes a storage element, a first switch, and a second switch. The first switch has two terminals and transitions from an off-state to an on-state when a first threshold voltage is applied between its terminals and then voltage between the terminals falls to a first hold voltage. The second switch has two terminals and transitions from an off-state to an on-state when a second threshold voltage is applied between its terminals and then voltage between the terminals falls to a second hold voltage. An off-current of the first switch is less than an off-current of the second switch. The first threshold voltage is greater than the second threshold voltage, which is greater than the first hold voltage, which is greater than or equal to the second hold voltage.

20 Claims, 6 Drawing Sheets

(56) References Cited

U.S. PATENT DOCUMENTS

| | | |
|---|---|---|
| 2010/0038617 A1 | 2/2010 | Nakajima et al. |
| 2014/0313816 A1* | 10/2014 | Ribeiro et al. ...... H01L 27/2463 365/148 |
| 2017/0229169 A1 | 8/2017 | Jo et al. |
| 2017/0263683 A1 | 9/2017 | Ramaswamy et al. |

* cited by examiner

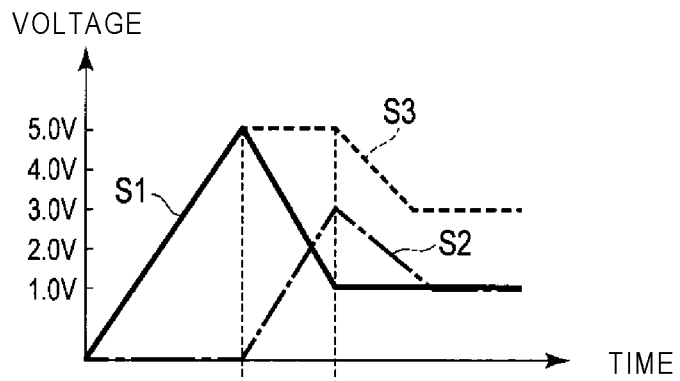
FIG. 7A
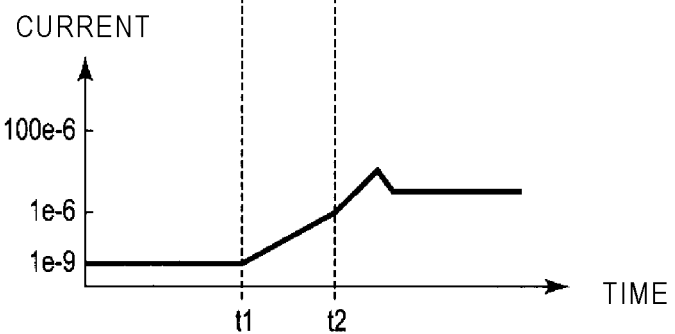
FIG. 7B
FIG. 8
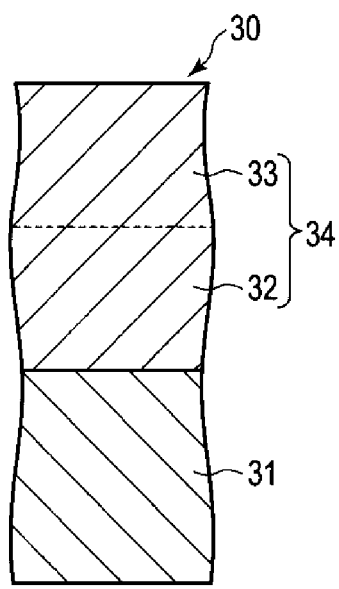

NONVOLATILE STORAGE DEVICE

CROSS-REFERENCE TO RELATED APPLICATION(S)

This application is based upon and claims the benefit of priority from Japanese Patent Application No. 2019-053603, filed Mar. 20, 2019, the entire contents of which are incorporated herein by reference.

FIELD

Embodiments described herein relate generally to a nonvolatile storage device.

BACKGROUND

A nonvolatile storage device can be configured as semiconductor integrated circuit device on a semiconductor substrate with a plurality of memory cells each having a structure in which a resistance change element, such as a magnetoresistive element, and a switching element are connected in series.

DESCRIPTION OF THE DRAWINGS

FIGS. 7A and 7B are timing charts schematically depicting operating characteristics of a nonvolatile storage device according to an embodiment.

FIG. 8 is a cross-sectional view schematically depicting a configuration of a memory cell in a first modification of a nonvolatile storage device according to an embodiment.

DETAILED DESCRIPTION

In general, according to one embodiment, a nonvolatile storage device comprises, a first interconnection extending in a first direction, a second interconnection extending in a second direction intersecting the first direction, and a memory cell between the first interconnection and the second interconnection in a third direction orthogonal to the first and second directions. The memory cell comprises a resistance change storage element, a first switching element, and a second switching element connected in series in some order. The first switching element has two terminals and transitions from an off-state to an on-state when a first threshold voltage is applied between the two terminals and then voltage between the two terminals falls to a first hold voltage. The second switching element has two terminals and transitions from an off-state to an on-state when a second threshold voltage is applied between the two terminals and then voltage between the two terminals falls to a second hold voltage. An off-current of the first switching element is less than an off-current of the second switching element. And, the first threshold voltage is greater than the second threshold voltage, which is greater than the first hold voltage, which is greater than or equal to the second hold voltage.

Example embodiments will be described hereinafter with reference to the drawings.

Figure 1:
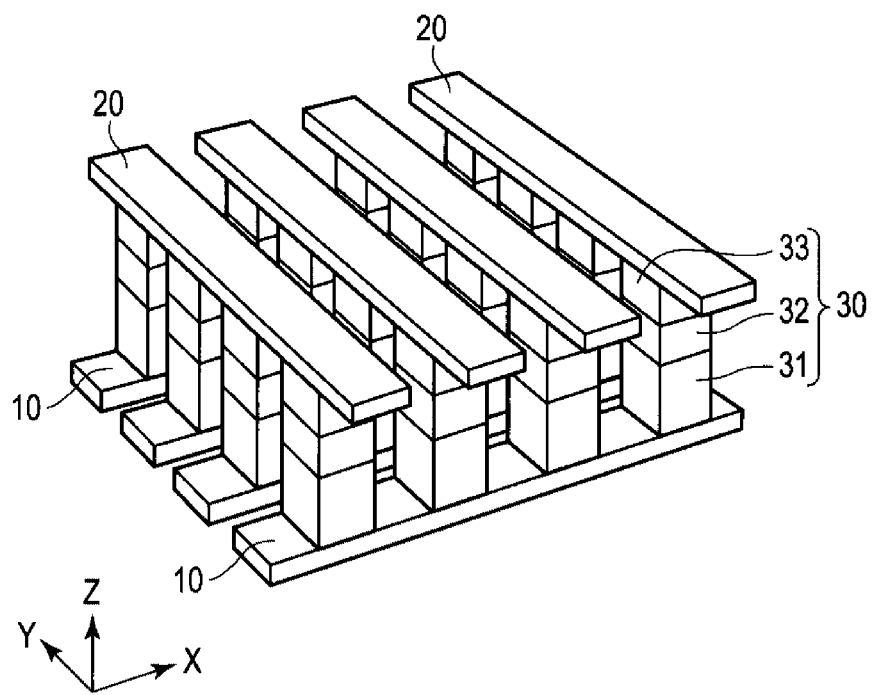
FIG. 1 is a perspective view schematically depicting an example of a configuration of a nonvolatile storage device according to an embodiment.

FIG. 1 is a plan view schematically depicting a configuration of a nonvolatile storage device, which is a semiconductor integrated circuit device, according to an embodiment.

As depicted in FIG. 1, the nonvolatile storage device has a structure in which memory cells 30 are between, in the Z direction, a plurality of first interconnections 10 and a plurality of second interconnections 20. The first interconnections 10, the second interconnections 20, and the memory cells 30 are provided on a principal surface side of a semiconductor substrate. Transistors, interconnections, and the like for peripheral circuits are also provided on the principal surface of the semiconductor substrate.

The first interconnections 10 intersect the second interconnections 20. In the present embodiment, the first interconnections 10 are orthogonal to the second interconnections 20. One of the first interconnections 10 or the second interconnections 20 corresponds to word lines, and the other interconnection 10 or 20 corresponds to bit lines.

Each memory cell 30 is connected between a first interconnection 10 and a second interconnection 20 and has a structure in which a magnetoresistive element 31 (also referred to as a nonvolatile resistance change storage element 31), a first selector 32, and a second selector 33 are connected in series. Specifically, the memory cell 30 is formed at a point of intersection point of the first interconnection 10 and the second interconnection 20, and the magnetoresistive element 31, the first selector 32, and the second selector 33 are in the Z direction between the first interconnection 10 and the second interconnection 20.

Figure 2:
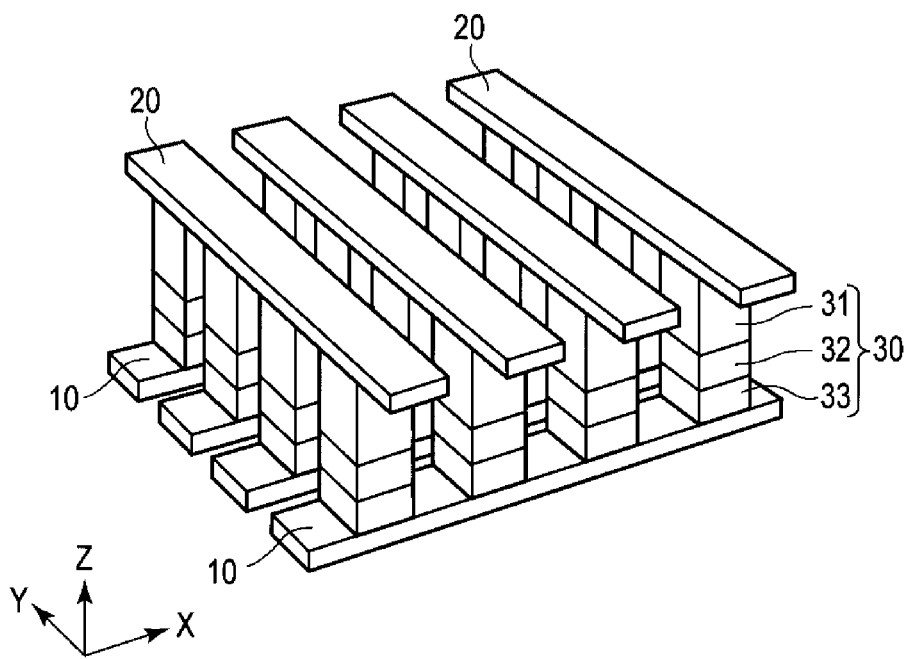
FIG. 2 is a perspective view schematically depicting another example of a configuration of a nonvolatile storage device according to an embodiment.

While the nonvolatile storage device depicted in FIG. 1 has the first selector 32 and the second selector 33 above the magnetoresistive element 31, the nonvolatile storage device may be configured with the magnetoresistive element 31 above the first selector 32 and the second selector 33 as depicted in FIG. 2.

Furthermore, in the nonvolatile storage device depicted in FIGS. 1 and 2, each memory cell 30 in which the first selector 32, the second selector 33, and the resistance change storage element 31 are connected in series. The structure of each memory cell 30 is not limited to this configuration and may be configured such that the resistance change storage element 31, the first selector 32, and the second selector 33 are connected to each other in any order. For example, an order of connecting the first selector 32 and the second selector 33 may be opposite to the connection orders depicted in FIG. 1 or 2.

Figure 3:
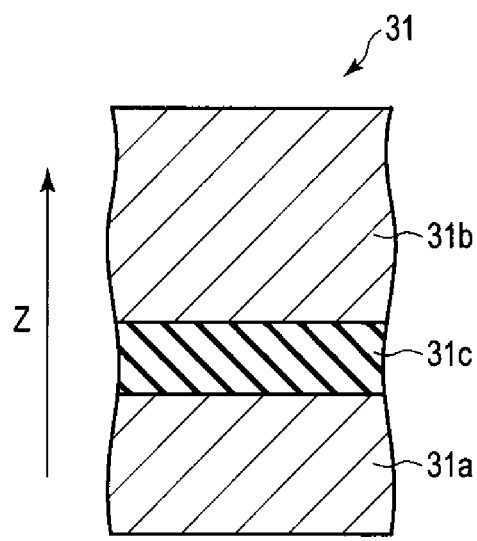
FIG. 3 is a cross-sectional view schematically depicting an example of a magnetoresistive element used in a nonvolatile storage device according to an embodiment.

FIG. 3 is a cross-sectional view schematically depicting a configuration of the magnetoresistive element 31 used in the nonvolatile storage device depicted in FIGS. 1 and 2. It is noted that the magnetoresistive element can also be referred to as a "MTJ element" or a "magnetic tunnel junction element."

The magnetoresistive element 31 depicted in FIG. 3 includes a storage layer 31a, a reference layer 31b, and a tunnel barrier layer 31c provided between the storage layer 31a and the reference layer 31b.

The storage layer 31a is a magnetic layer formed with a ferromagnetic material and has a variable magnetization direction. The variable magnetization direction means that a magnetization direction varies with a predetermined write current. The storage layer 31a is, for example, formed with a ferromagnetic material having perpendicular magnetic anisotropy. The storage layer 31a contains, for example, at least iron (Fe) or cobalt (Co). The storage layer 31a may further contain boron (B) in addition to iron (Fe) or cobalt (Co).

The reference layer 31b is a magnetic layer formed with a ferromagnetic material and has a pinned magnetization direction. The pinned magnetization direction means that a magnetization direction does not vary with a predetermined write current. The reference layer 31b includes a first layer portion that is adjacent to the tunnel barrier layer 31c and a second layer portion that is not adjacent to the tunnel barrier layer 31c. The first layer portion, for example, is formed with a ferromagnetic material having perpendicular magnetic anisotropy, and contains iron (Fe), cobalt (Co), and boron (B). The second layer portion, for example, is formed with a ferromagnetic material having perpendicular magnetic properties, and contains at least one element selected from among cobalt (Co), platinum (Pt), nickel (Ni), and palladium (Pd).

The tunnel barrier layer 31c is a non-magnetic, insulating layer between the storage layer 31a and the reference layer 31b, and contains magnesium (Mg) and oxygen (O).

It is noted that the magnetoresistive element 31 may further include a shift canceling layer that has a pinned magnetization direction antiparallel to the magnetization direction of the reference layer 31b and that has a function to cancel a magnetic field applied from the reference layer 31b to the storage layer 31a. In that case, the shift canceling layer has perpendicular magnetic properties and contains, for example, at least one element selected from among cobalt (Co), platinum (Pt), nickel (Ni), and palladium (Pd).

The magnetoresistive element 31 described above is an spin transfer torque (STT) type magnetoresistive element having perpendicular magnetization.

The magnetoresistive element 31 has a low resistance state in which the magnetization direction of the storage layer 31a is parallel to the magnetization direction of the reference layer 31b, and a high resistance state in which the magnetization direction of the storage layer 31a is antiparallel to the magnetization direction of the reference layer 31b. The magnetoresistive element 31 can, therefore, store binary data (0 or 1) depending on the resistance state (low resistance state or high resistance state). In addition, the low resistance state or the high resistance state can be set depending on a direction of a current flowing through the magnetoresistive element 31.

Figure 4:
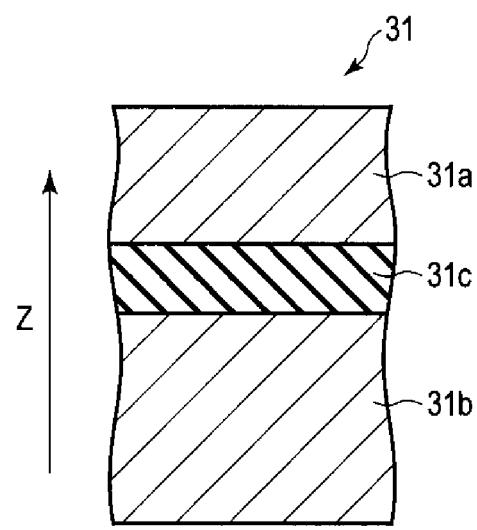
FIG. 4 is a cross-sectional view schematically depicting another example of a magnetoresistive element used in a nonvolatile storage device according to an embodiment.

While the magnetoresistive element 31 depicted in FIG. 3 has a configuration such that the storage layer 31a, the tunnel barrier layer 31c, and the reference layer 31b are stacked in this order from a lower layer side (semiconductor substrate side), the magnetoresistive element 31 may have a configuration such that the reference layer 31b, the tunnel barrier layer 31c, and the storage layer 31a are stacked in this order from the lower layer side as depicted in FIG. 4.

Figure 5:
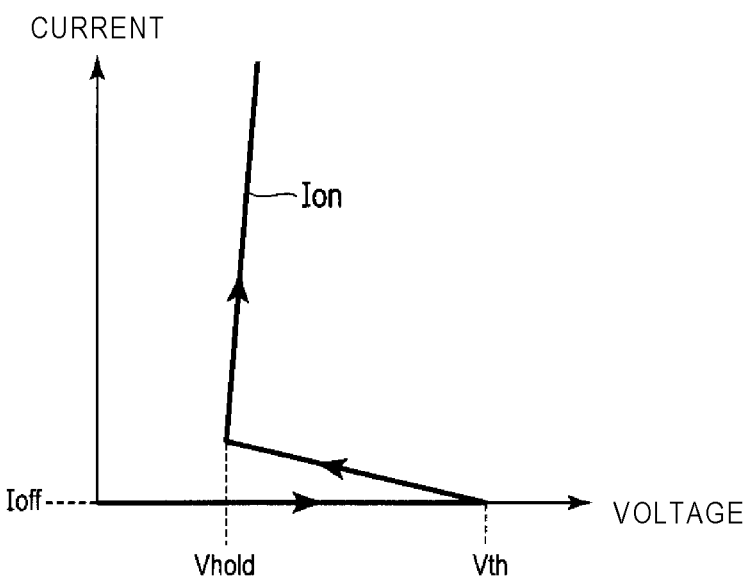
FIG. 5 graph depicting voltage-current characteristics of a selector used in a nonvolatile storage device according to an embodiment.

A switching element having a two-terminal type switching function having voltage-current characteristics as schematically depicted in FIG. 5 is used as each of the first selector 32 and the second selector 33 depicted in FIGS. 1 and 2. That is, each of the first selector 32 and the second selector 33 transitions from an off-state to an on-state when a threshold voltage Vth is applied to the respective two terminals and that the voltage then falls to a hold voltage Vhold. A high on-current Ion flows through each of the first selector 32 and the second selector 33 when in the on-state, and only a minute (small) off-current Ioff flows through each of the first selector 32 and the second selector 33 when in the off-state.

As each of the first selector 32 and the second selector 33, a two-terminal type switching element containing a chalcogen element, for example, may be used.

A two-terminal type switching element containing a chalcogen element is in a high resistance state (for example, an electrically non-conducting state) when a voltage applied to the two terminals is lower than the threshold voltage Vth. When the voltage applied to the two terminals is higher than the threshold voltage Vth, the two-terminal type switching element transitions into a low resistance state (for example, an electrically conducting state). The two-terminal switching element may function bi-directionally. In some examples, the switching elements described above may contain at least one chalcogen element selected from a group consisting of, for example, tellurium (Te), selenium (Se), nitrogen (N), and sulfur (S). Alternatively, the switching element may contain chalcogenide, which is a compound containing at least one chalcogen elements. Furthermore, the switching element may comprise at least one element selected from a group of elements consisting of born (B), aluminum (Al), gallium (Ga), indium (In), carbon (C), silicon (Si), germanium (Ge), tin (Sn), arsenic (As), phosphorous (P), nitrogen (N), and antimony (Sb).

The first selector 32 and the second selector 33 have different voltage-current characteristics from one another. A threshold voltage of the first selector 32 is represented by Vth1 (and may be referred to as the first threshold voltage Vth1) and a threshold voltage of the second selector 33 by Vth2 (and may be referred to as the second threshold voltage Vth2). A hold voltage of the first selector 32 is represented by Vhold1 (and may be referred to as the first hold voltage Vhold1) and a hold voltage of the second selector 33 by Vhold2 (and may be referred to as the second hold voltage Vhold2). An off-current of the first selector 32 is represented by Ioff1 and an off-current of the second selector 33 by Ioff2. In this case, the following relationship is satisfied.

$$Vth1 > Vth2 > Vhold1 \geq Vhold2 \tag{Expression 1}$$

$$Ioff1 < Ioff2 \tag{Expression 2}$$

Figure 6A:
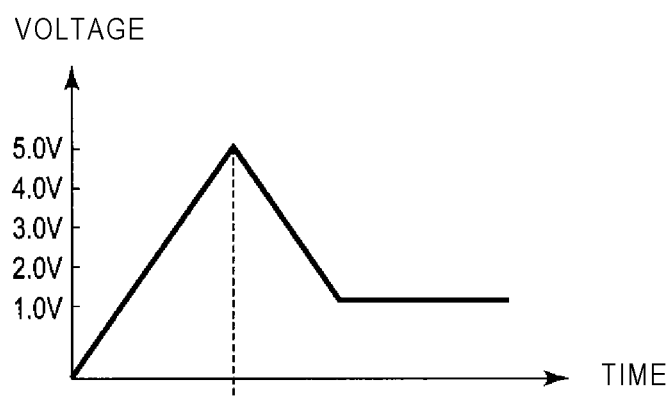
FIGS. 6A and 6B are timing charts schematically depicting operating characteristics of a nonvolatile storage device according to a comparative example.
Figure 6B:
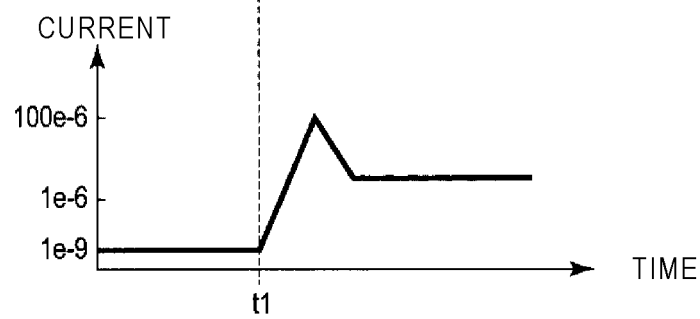

FIGS. 6A and 6B are timing charts schematically depicting operating characteristics of a nonvolatile storage device according to a comparative example. In the nonvolatile storage device according to the comparative example, a single magnetoresistive element and a single selector are connected in series in each memory cell. FIG. 6A depicts a voltage applied across two terminals of the comparative selector, and FIG. 6B depicts a current flowing through the comparative selector (which is equivalent to current flowing through the comparative memory cell). It is assumed that in the selector according to the comparative example a threshold voltage (Vthc) is 5.0 V, a hold voltage (Vholdc) is 1.0 V, and an off-current (Ioffc) is 1e−9 A (1×10$^{-9}$ A).

When the voltage applied to the selector reaches the threshold voltage Vthc (5.0 V) at time t1, then the selector is turned on and the on-current begins to flow through the memory cell. However, an overshoot occurs in response to a difference (Vthc−Vholdc) between the threshold voltage Vthc and the hold voltage Vholdc of the selector, and an excessive current flows through the memory cell of the comparative example. Owing to this, a read disturb or breakdown possibly occurs in this comparative example.

FIGS. 7A and 7B are timing charts schematically depicting operating characteristics of the nonvolatile storage device according to an embodiment. In FIG. 7A, line S1 (solid line) represents voltage applied across two terminals of the first selector 32, line S2 (dash-dot line) represents voltage applied across two terminals of the second selector 33, and line S3 (dashed line) represents voltage applied across two terminals of the first selector 32 and the second selector 33 connected together in series. FIG. 7B depicts current flowing through both the first selector 32 and the second selector 33 connected in series (which is equivalent to the current flowing through the memory cell 30).

It is assumed that Vth1=5.0 V, Vth2=3.0 V, Vhold1=1.0 V, Vhold2=1.0 V, Ioff1=1e−9 A, and Ioff2=1e−6 A.

When the voltage applied to the first selector 32 reaches the first threshold voltage Vth1 (5.0 V) at time t1, the first selector 32 is turned on. At this time, the second selector 33 is still turned off; thus, an overshoot does not occur. When the voltage applied to the second selector 333 reaches the second threshold voltage Vth2 (3.0 V) at time t2, then the second selector 32 is also turned on. As a result, an overshoot occurs in response to a difference (Vth2−Vhold2) between the second threshold voltage Vth2 and the second hold voltage Vhold2 of the second selector 33. However, the second threshold voltage Vth2 (3.0 V) is lower than the first threshold voltage Vth1 (5.0 V); thus, the overshoot amount can be reduced.

As described so far, according to the present embodiment, the memory cell includes the magnetoresistive element 31, the first selector 32, and the second selector 33 connected in series and by setting a relationship among the threshold voltages (Vth1 and Vth2), the hold voltages (Vhold1 and Vhold2), and the off-currents (Ioff1 and Ioff2) to satisfy Expression 1 and Expression 2 it is possible to limit overshoot at the time of selecting a memory cell 30. As a result, it is possible to reduce the possibility of the read disturb and breakdown and thus to exercise appropriate memory cell control.

Moreover, according to the present embodiment, it is possible to prevent a problem that occurs at a time of a half-selection of the memory cell 30. Here, half-selection refers to the voltage (half-select voltage) applied to unselected memory cells which are connected to a word line shared by a selected memory cell or, similarly, to unselected memory cells connected to a bit line shared by a selected memory cell. The half-select voltage is approximately half the voltage applied to a selected memory cell. Supposing that only the second selector 33 was provided in a memory cell and the first selector 32 was not, then unselected memory cells could possibly be erroneously turned on when the half-select voltage is applied. In the present embodiment, providing a first selector 32 having the first threshold voltage Vth1 higher than the second threshold voltage Vth2 of the second selector 33 makes it possible to prevent memory cells in a half-selected state from being erroneously turned on.

It is noted that operations of the present embodiment described above are applicable to any of a write operation or a read operation for the memory cells 30.

Various modifications of the present embodiment will next be described.

FIG. 8 is a cross-sectional view schematically depicting a configuration of the memory cell 30 according to a first modification. While the first selector 32 and the second selector 33 are provided as discrete, separate elements/layer in the above-described embodiment, the first selector 32 and the second selector 33 are not necessarily required to be provided in this manner and the first selector 32 and the second selector 33 can be provided as one selector 34 having a continuous configuration in the first modification. Specifically, in the first modification, a composition of a material configuring the first selector 32 and a composition of a material configuring the second selector 33 continuously changes along the stacking direction. Even with such a configuration, similar functions to those described above can be realized if the material portion of selector 34 forming the first selector 32 and a material portion of selector 34 forming the second selector 33 have a relationship that satisfies Expressions 1 and 2.

Figure 9:
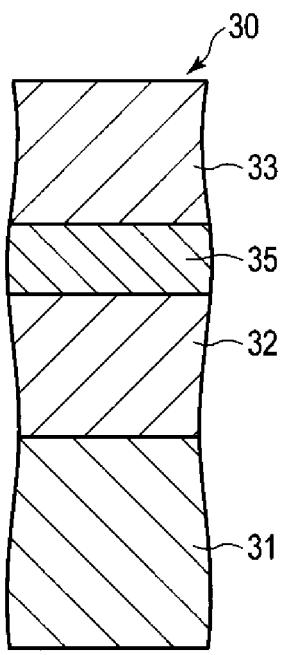
FIG. 9 is a cross-sectional view schematically depicting a configuration of a memory cell in a second modification of a nonvolatile storage device according to an embodiment.

FIG. 9 is a cross-sectional view schematically depicting a configuration of the memory cell 30 according to a second modification. In the second modification, a conductive spacer layer 35 is between the first selector 32 and the second selector 33. For example, a metal layer may be used as the spacer layer 35. Even with such a configuration, similar functions to those in the above-described embodiment can still be realized if the first selector 32 and the second selector 33 have a relationship that satisfies Expressions 1 and 2.

Figure 10:
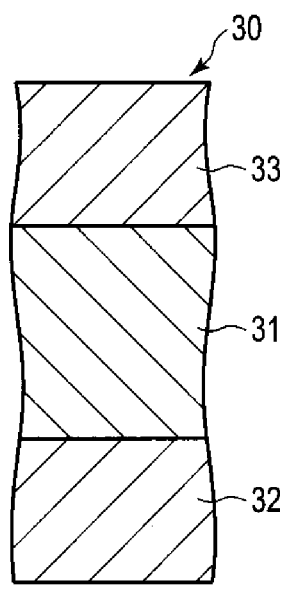
FIG. 10 is a cross-sectional view schematically depicting a configuration of a memory cell in a third modification of a nonvolatile storage device according to an embodiment.

FIG. 10 is a cross-sectional view schematically depicting a configuration of the memory cell 30 according to a third modification. While the memory cell 30 according to the above-described embodiment includes a resistance change storage element 31 connected in series to the stacked the first selector 32 and the second selector 33, the memory cell 30 according to the third modification has the resistance change storage element 31 between the first selector 32 and the second selector 33. Even with such a configuration, similar functions to those in the above-described embodiment can be realized if the first selector 32 and the second selector 33 have a relationship that satisfies Expressions 1 and 2.

Figure 11:
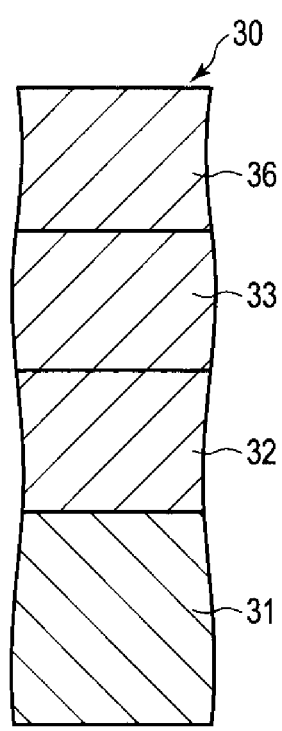
FIG. 11 is a cross-sectional view schematically depicting a configuration of a memory cell in a fourth modification of a nonvolatile storage device according to an embodiment.

FIG. 11 is a cross-sectional view schematically depicting a configuration of the memory cell 30 according to a fourth modification. While the memory cell 30 in the above-described embodiment includes two selectors (first selector 32 and second selector 33) connected in series, the memory cell 30 may include three or more selectors connected in series. In an example depicted in FIG. 11, the memory cell 30 includes the first selector 32, the second selector 33, and a third selector 36 connected in series.

A threshold voltage of the third selector 36 is represented by Vth3 (and may be referred to a third threshold voltage Vth3), a hold voltage of the third selector 36 is represented by Vhold3 (and may be referred to as a third hold voltage Vhold3), and an off-current of the third selector 36 is represented by Ioff3 (and may be referred to as a third off-current Ioff3). In this case, it is preferable that the following relationship is satisfied.

$$Vth1 > Vth2 > Vth3 > Vhold1 \geq Vhold2 \geq Vhold3$$

$$Ioff1 < Ioff2 < Ioff3$$

In general, in a case where the memory cell 30 includes n total selectors, where n is an integer equal to or greater than 2, a threshold voltage, a hold voltage, and an off-current of a x-th selector, where x is an integer that satisfies 1≤x≤n, are represented by Vthx, Vholdx, and Ioffx, and a threshold voltage, a hold voltage, and an off-current of a y-th selector, where y is an integer that satisfies 1≤y≤n and y≠n, are represented by Vthy, Vholdy, and Ioffy. In such a case then it is preferable that the following relationship is satisfied.

$$Vthx > Vthy > Vholdx \geq Vholdy$$

$$Ioffx < Ioffy$$

While the magnetoresistive element is used as the resistance change storage element 31 in the example embodiment described above, a nonvolatile resistance change storage element other than the magnetoresistive element may be used instead according to the present disclosure.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A nonvolatile storage device, comprising:
    a first interconnection extending in a first direction;
    a second interconnection extending in a second direction intersecting the first direction; and
    a memory cell between the first interconnection and the second interconnection in a third direction orthogonal to the first and second directions, the memory cell comprising a resistance change storage element, a first switching element, and a second switching element connected in series, wherein
    the first switching element has two terminals and transitions from an off-state to an on-state when a first threshold voltage is applied between the two terminals and then voltage between the two terminals falls to a first hold voltage,
    the second switching element has two terminals and transitions from an off-state to an on-state when a second threshold voltage is applied between the two terminals and then voltage between the two terminals falls to a second hold voltage,
    an off-current of the first switching element is less than an off-current of the second switching element, and
    the first threshold voltage is greater than the second threshold voltage, which is greater than the first hold voltage, which is greater than or equal to the second hold voltage.

2. The nonvolatile storage device according to claim 1, wherein
    the resistance change storage element is contacting the first interconnection,
    the first switching element is contacting the resistance change storage element, and
    the second switching element is contacting the first switching element and the second interconnection.

3. The nonvolatile storage device according to claim 1, wherein the first switching element is between the resistance change storage element and the second switching element.

4. The nonvolatile storage device according to claim 3, further comprising:
    a conductive spacer layer between the first and second switching elements.

5. The nonvolatile storage device according to claim 1, further comprising:
    a conductive spacer layer between the first and second switching elements.

6. The nonvolatile storage device according to claim 1, wherein the second switching element is between resistance change storage element and the first switching element.

7. The nonvolatile storage device according to claim 1, wherein resistance change storage element is between the first switching element and the second switching element.

8. The nonvolatile storage device according to claim 1, wherein
    the first and second selectors are adjacent to each other in the third direction, and
    a composition ratio of a chalcogen in the first switching element and a composition of ratio of the chalcogen in the second switching element each continuously changes along the third direction.

9. The nonvolatile storage device according to claim 1, further comprising:
    a third switching element between the first and second interconnection in the third direction in series with the first switching element, the second switching element, and the resistance change storage element, wherein
    the third switching element has two terminals and transitions from an off-state to an on-state when a third threshold voltage is applied between the two terminals and then voltage between the two terminals falls to a third hold voltage,
    an off-current of the third switching element is greater than the off-current of the second switching element,
    the third threshold voltage is less than the second threshold voltage and greater than the first hold voltage, and
    the third hold voltage is less than or equal to the second hold voltage.

10. The nonvolatile storage device according to claim 9, wherein the third switching element is adjacent to the second switching element in the third direction.

11. The nonvolatile storage device according to claim 9, wherein the first and second switching elements are between the third switching element and the resistance change storage element.

12. The nonvolatile storage device according to claim 1, wherein the resistance change storage element is a magnetoresistive element.

13. The nonvolatile storage device according to claim 12, wherein the resistance change storage element comprises a first ferromagnetic layer, a second ferromagnetic layer, and a tunnel barrier layer between the first and second ferromagnetic layers in the third direction.

14. A nonvolatile storage device, comprising:
    a plurality of first interconnections extending in a first direction and spaced from each other in a second direction;
    a plurality of second interconnections extending in the second direction and spaced from each other in the first direction; and
    a plurality of memory cells, each memory cell being connected between one first interconnection and one second interconnection in a third direction orthogonal to the first and second directions, each memory cell comprising a resistance change storage element, a first switching element, and a second switching element connected in series, wherein each first switching element has two terminals and transitions from an off-state to an on-state when a first threshold voltage is applied between the two terminals and then voltage between the two terminals falls to a first hold voltage, each second switching element has two terminals and transitions from an off-state to an on-state when a second threshold voltage is applied between the two terminals and then voltage between the two terminals falls to a second hold voltage, an off-current of the first switching elements is less than an off-current of the second switching elements, and the first threshold voltage is greater than the second threshold voltage, which is greater than the first hold voltage, which is greater than or equal to the second hold voltage.

15. The nonvolatile storage device according to claim 14, wherein each first switching element is connected between a resistance change storage element and a second switching element in the third direction.

16. The nonvolatile storage device according to claim 14, further comprising:
 a conductive spacer layer between each first and second switching elements.

17. The nonvolatile storage device according to claim 14, wherein each resistance change storage element is between a first switching element and a second switching element.

18. The nonvolatile storage device according to claim 14, wherein, in each memory cell, the first and second selectors are adjacent to each other in the third direction, and a composition ratio of a chalcogen in the first switching element and a composition of ratio of the chalcogen in the second switching element each continuously changes along the third direction.

19. The nonvolatile storage device according to claim 14, wherein each memory cell includes a third switching element in series with the first switching element, the second switching element, and the resistance change storage element, the third switching element has two terminals and transitions from an off-state to an on-state when a third threshold voltage is applied between the two terminals and then voltage between the two terminals falls to a third hold voltage, an off-current of the third switching element is greater than the off-current of the second switching element, the third threshold voltage is less than the second threshold voltage and greater than the first hold voltage, and the third hold voltage is less than or equal to the second hold voltage.

20. A nonvolatile storage device, comprising:
a bit line extending in a first direction;
a word line extending in a second direction intersecting the first direction; and
a memory cell connected between the bit line and the word line, the memory cell comprising a magnetoresistive element, a first switching element, and a second switching element connected in series, wherein the first switching element transitions from an off-state to an on-state when a first threshold voltage is applied between the first switching element and has a first hold voltage while in the on-state, the second switching element transitions from an off-state to an on-state when a second threshold voltage is applied between the second switching element and has a second hold voltage while in the on-state, an off-current of the first switching element is less than an off-current of the second switching element, and the first threshold voltage is greater than the second threshold voltage, which is greater than the first hold voltage, which is greater than or equal to the second hold voltage.

\* \* \* \* \*